INVENTOR
ALAN W. WILKERSON
BY Lieber & Nilles
ATTORNEYS

Feb. 23, 1971 A. W. WILKERSON 3,566,287

AMPLIFIER CIRCUIT HAVING PAIRED COMPLEMENTARY AMPLIFIERS FOR PROVIDING TWO OPPOSITE POLARITY OUTPUTS

Original Filed Oct. 21, 1965 2 Sheets-Sheet 2

INVENTOR
ALAN W. WILKERSON

BY Lieber & Nilles

ATTORNEYS

United States Patent Office
3,566,287
Patented Feb. 23, 1971

3,566,287

AMPLIFIER CIRCUIT HAVING PAIRED COMPLEMENTARY AMPLIFIERS FOR PROVIDING TWO OPPOSITE POLARITY OUTPUTS

Alan W. Wilkerson, Thiensville, Wis., assignor, by mesne assignments, to Web Press Engineering, Inc., Addison, Ill., a corporation of Illinois Original application Oct. 21, 1965, Ser. No. 499,409, now Patent No. 3,435,316, dated Mar. 25, 1969. Divided and this application Oct. 16, 1968, Ser. No. 768,037
Int. Cl. H03f *3/18, 3/68*
U.S. Cl. 330—14 9 Claims

ABSTRACT OF THE DISCLOSURE

An amplifier circuit suitable for connection to a bi-polarity input signal provides a pair of bi-polarity output signals responsive to the input signal. The amplifier circuit includes a pair of complementary amplifiers having their inputs receiving the input signal. One of the complementary amplifiers produces an output signal directly proportional in magnitude and corresponding in polarity to the input signal. The other of the complementary amplifiers produces an output signal inverse in polarity, but directly proportional in magnitude, to the input signal.

CROSS-REFERENCES TO RELATED APPLICATIONS

This application is a division of co-pending application Ser. No. 499,409, filed Oct. 21, 1965, now U.S. Pat 3,435,-316 issued on Mar. 25, 1969.

BACKGROUND OF THE INVENTION—FIELD OF THE INVENTION

The present invention relates to amplifier circuits and more particularly to amplifier circuits providing a plurality of output signals. Such an amplifier may be used in a static, regenerative direct current motor control.

BACKGROUND OF THE INVENTION—DESCRIPTION OF THE PRIOR ART

Prior art static regenerative controls suffer numerous failings. Specifically, these controls have generally required a substantial error signal, for example, 50 r.p.m. out of 1800 r.p.m., in order to switch the control from motoring operation to regenerative operation. This allows considerable overshoot and prevents the accurate speed regulation desired from a regenerative control. This may also prevent the motor from attaining, and maintaining, zero speed under loaded conditions. Such failings have often been due to the lack of a satisfactory means for amplifying the input error signal to the control and for applying it to the remainder of the control.

SUMMARY OF THE INVENTION

It is, therefore, the object of the present invention to provide an amplifier suitable for use in regenerative direct current motor control for amplifying the input error signal thereto.

It is a further object of the present invention to provide such an amplifier which generates a pair of output signals proportional in magnitude to an input signal. The polarity of one such output signal is the same as the polarity of the input signal while the polarity of the other such output signal is inverted in polarity with respect to the input signal.

An additional object of this invention is to provide an amplifier generating a pair of output signals which has an abrupt saturation point in both outputs.

Yet another object of this invention is to provide an amplifier generating a pair of output signals proportional to an input signal including a means to limit the input signal so as to prevent overdriving the amplifier and destroying the equality between the two output signals.

A further object of this invention is to provide an amplifier having zero voltage at its input terminals. This permits a plurality of the amplifiers to be functionally related without imbalance.

The present invention provides an amplifier circuit suitable for connection to a bi-polarity input signal and for providing a pair of bi-polarity output signals responsive thereto. One of the output signals corresponds directly in polarity to the input signal. The other of the output signals is inverse in polarity with respect to the input signal.

The amplifier circuit includes a pair of complementary amplifiers having their inputs receiving the input signal. One of the complementary amplifiers produces an output signal directly proportional in magnitude and corresponding in polarity to the input signal. The other of the amplifiers produces an output signal inverse in polarity, but directly proportional in magnitude, to the error signal.

The amplifier circuit includes a feedback control means operatively associated with the pair of complementary amplifiers for causing the total of the output signals of the complementary amplifiers to be equal to a constant value. Thus, a change in the output signal from one amplifier causes an equal but opposite change in the output signal from the other amplifier, thereby to generate the desired signals.

BRIEF DESCRIPTION OF THE DRAWING

The specification includes the following drawings, forming a part thereof.

DESCRIPTION OF PREFERRED EMBODIMENT—BRIEF DESCRIPTION OF STATIC, REGENERATIVE, DC MOTOR CONTROL

In the following specification the static, regenerative, DC motor control is described as one in which the speed of the DC motor is regulated. It is to be understood that other operative conditions of the motor, such as torque, or operative conditions in the apparatus driven by the direct current motor, as for example, web tension, may be the regulated quantity. Hence, the present invention is not to be construed solely as a motor speed control.

Figure 1:
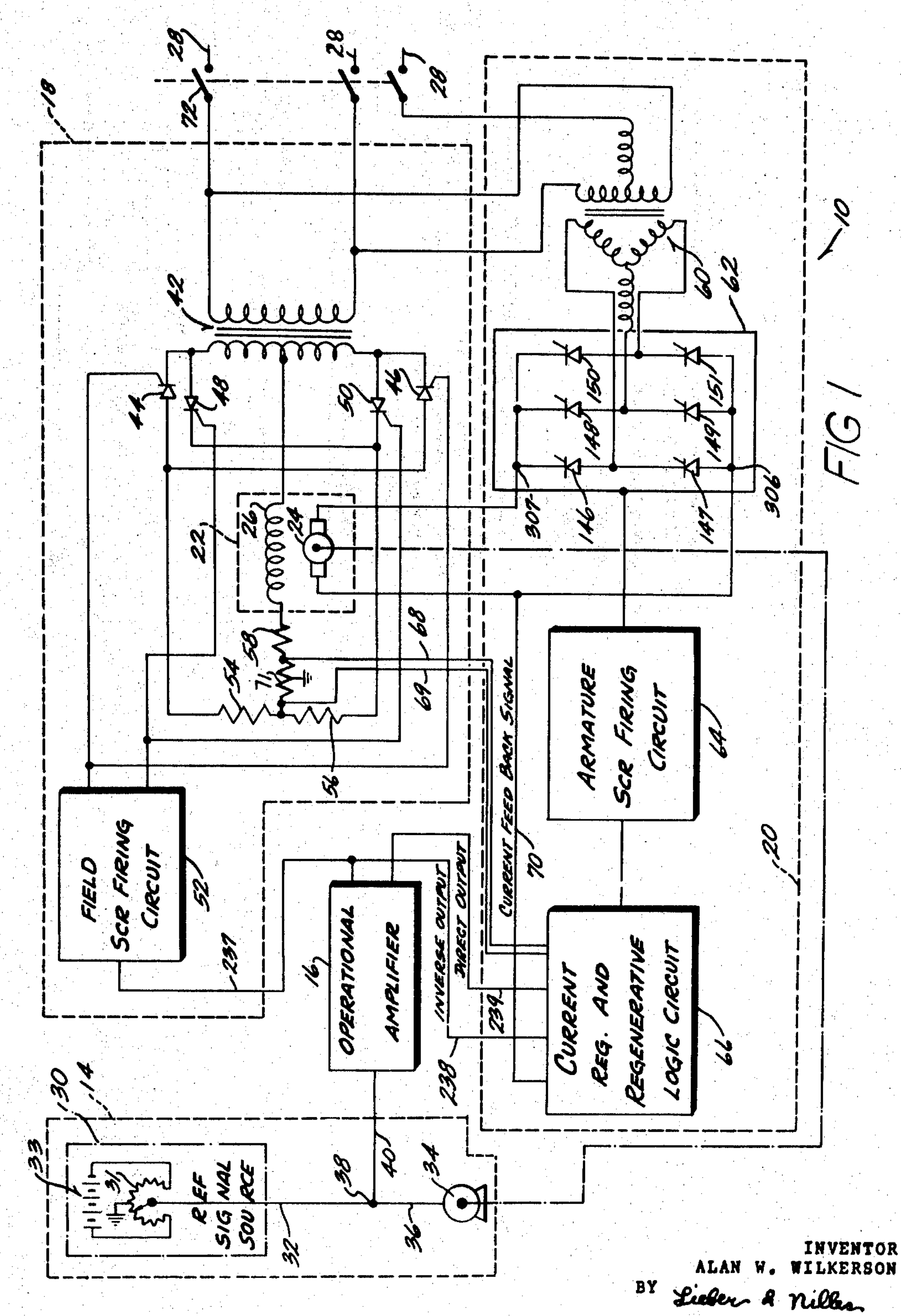
FIG. 1 is a schematic diagram of the static, regenerative direct current motor control in which the amplifier circuit of the present invention may be employed.

Referring now to the drawings, and specifically FIG. 1, a block diagram of a static, regenerative, DC motor control 10. Control 10 includes reference and feedback circuit 14, amplifier circuit 16 constructed in accordance with the present invention, field circuit 18, and armature circuit 20. The control drives the DC motor 22 consisting of armature 24 and motor field 26, each of which includes or comprises an electromagnetic coil or winding. The control is provided with input power from three phase AC lines 28.

Reference and feedback circuit 14 includes a reference signal source 30 providing a variable DC signal to conductor 32 by means of DC supply 33 and potentiometer 31. A feedback signal is provided by tachometer 34 which is connected to armature 24 and supplies a DC signal corresponding to the speed of armature 24 to conductor 36. Conductors 32 and 36 are joined at mixing junction 38 which provides an error signal to conductor 40. This error signal may be of either polarity and serves as a motoring control signal in one polarity and a regenerative braking control signal in the other polarity.

The error signal in conductor 40 is fed to amplifier circuit 16 which provides a high degree of amplification to the error signal. In subsequent portions of the specification or in the claims, this amplifier circuit may be termed the "first" or "operational" amplifier to distinguish it from other amplifiers in control 10. Amplifier circuit 16 has two output signals, both of which have abrupt saturation points. Both of the signals are proportional in magnitude to the input signal. However, the polarity of one output signal is the same as the polarity of the input error signal in conductor 40 (termed the direct output signal) while the other output signal is of the opposite polarity from the input error signal in conductor 40 (termed the inverse output signal). The graph of these output signals forms an X with the direct output signal forming one stroke, and the inverse output signal forming the other and the two signals meeting at zero output for operational amplifier 16. One of the output signals is used to control both field circuit 18 and armature circuit 20 while the other is used to control only armature circuit 20. While FIG. 1 shows the inverse output signal of operational amplifier 16 as being supplied to both field circuit 18 and armature circuit 20 and the direct output signal of operational amplifier 16 as supplied through conductor 239 to armature circuit 20 only, the connection of these output signals may be reversed and the invention is not to be interpreted as limited to the connection shown in FIG. 1. In any event, both signals are employed throughout all operational sequences of control 10.

Field circuit 18 includes motor field 26. The field circuit is supplied with alternating current from AC supply lines 28 through transformer 42. The output of transformer 42 contains a controlled rectifier means comprising two groups of oppositely connected controlled rectifiers 44 and 46 and 48 and 50. These rectifiers control the direction of current flow through the winding of motor field 26, one group of rectifiers being energized for each direction of current flow. A field controlled rectifier firing circuit 52, which may be considered a push-pull proportional firing circuit, controls the operation of controlled rectifiers 44 through 50 in response to the inverse output signal from operational amplifier 16. The control provided by field controlled rectifier firing circuit 52 determines which group of controlled rectifiers will be placed in the conductive state and may also include a determination of the magnitude of the field current. Firing circuit 52 also provides for rapid reversal of the current through motor field 26 by controlling the operation of the controlled rectifiers in a manner to regenerate the motor field current back to AC supply lines 28.

Field circuit 18 also contains a resistive network comprising resistors 54 and 56. These resistors act as a limiting impedance to prevent short circuits in the motor field power circuit in the event of faulty firing of the controlled rectifiers and, as a secondary function, reduce the time constant of motor field 26. Resistors 58 and 71 provide a means of sensing the polarity of the motor field current.

Armature circuit 20 supplies power to armature 24 during motoring operation and receives power from armature 24 during regenerative operation. Armature circuit 20 is supplied with power during motoring operation from AC supply lines 28 through transformer 60. The amount of power provided to armature 24 is controlled by armature controlled rectifier bridge 62 containing controlled rectifiers 146 through 151. Terminals 306 and 307 constitute the output terminals of control 10. During regenerative operation power is supplied from motor armature 24 through armature controlled rectifier bridge 62 and transformer 60 back to AC supply lines 28.

Armature controlled rectifier firing circuit 64 controls the operation of the rectifiers in armature controlled rectifier bridge 62. In order to provide reverse voltage capabilities, this firing circuit must be capable of controlling the operation of the controlled rectifiers through one entire half cycle of alternating current from supply lines 28 and through a portion of the other half cycle.

The current regulating and regenerative logic circuit 66 performs a dual function. The regenerative logic portion thereof determines whether a combination of conditions in control are proper for the regenerating or motoring operation and operates armature circuit 20 accodingly. In making such determination, the logic circuit utilizes a pair of AND gates operable by a field polarity signal supplied by sensing resistors 58 and 71 through conductors 68 and 69 as well as the direct and inverse output signals from operational amplifier 16 supplied through conductors 238 and 239. The current regulating portion of circuit 66 regulates the armature current during motoring or regenerative operation and utilizes an armature current feedback signal supplied by conductor 70.

DESCRIPTION OF OPERATION OF STATIC REGENERATIVE DC MOTOR CONTROL

Figure 2:
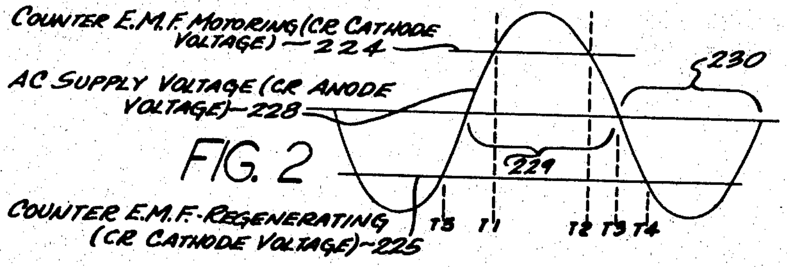
FIG. 2 is a graph of an alternating current wave form showing the principles of motoring and regenerative operation of the control.

The operation of control 19 may be better understood by initial reference to FIG. 2 in which the numeral 228 indicates the alternating voltage supplied to the control through AC supply lines 28. The supply voltage 228 includes a positive half cycle 229 and a negative half cycle 230. Only a single phase of alternating current is shown in FIG. 2 to simplify the explanation.

Armature 24 generates a counter E.M.F. while rotating in the motoring state. This counter E.M.F. is indicated in FIG. 2 by the graph 224 for the motoring operation of control 10. The controlled rectifiers 146, 148, and 150 in the armature rectifier bridge 62 may conduct any time applied voltage 228 is more positive than counter E.M.F. 224 since, as shown in FIG. 1, the anodes of the controlled rectifiers may be considered connected to A.C. supply voltage 228 while the cathodes of the rectifiers are connected to the armature and counter E.M.F. 224. The controlled rectifiers are properly biased for conduction anytime the anodes are more positive than the cathodes. This is the time interval between $T_1$ and $T_2$. The amount of power supplied to armature 24 and the speed of the motor 22 during motoring operation is determined by the point between $T_1$ and $T_2$ at which the rectifiers of rectifier bridge 62 are rendered conductive. The closer to time $T_1$ the rectifiers are rendered conductive, the greater the supplied power.

During regenative operation, the energization of motor field 26 is reversed, reversing the polarity of the counter E.M.F. of the motor. The reversed counter E.M.F. is shown by the graph 225 in FIG. 2. It will be noted that the time during which the counter E.M.F. of the motor is more negative than the applied voltage is now much greater, extending from time $T_5$ to time $T_4$. Referring to negative half cycle 230 it will also be noted that from time $T_3$ to time $T_4$ the voltage on the anodes of the controlled rectifiers 146, 148, and 150 in bridge 62, that is, applied alternating voltage 228 has negative polarity with reference to the A.C. source.

Since the anodes of the controlled rectifiers are more positive than the cathodes thereof, even though they are negative with reference to the A.C. source, the controlled rectifiers can conduct current in the same direction through bridge 62 if a signal is provided from armature controlled rectifier firing circuit 64. This current will flow from armature 24 through the controlled rectifiers of armature bridge 62 and through transformer 60 in regenerative fashion to A.C. supply lines 28. This is due to the fact that the polarity of the voltage on bridge 62 has reversed while the direction of current flow therethrough remains the same.

It is evident from the foregoing that armature controlled rectifier firing circuit 64 must be capable of firing the controlled rectifiers both from time $T_1$ to time $T_2$, for motoring operation, i.e., when the counter E.M.F. is more negative than the applied A.C. voltage, and also between time $T_3$ and $T_4$ for regenerative operation, i.e., when the applied A.C. voltage has reversed its polarity but before it becomes more negative than the counter E.M.F.

The operation of control 10 in the manner shown graphically in FIG. 2 is accomplished by employing two operational loops. These may be termed the inner loop and the outer loop to indicate that the former operates within the confines of the latter. The outer operational loop is utilized to control motor speed and comprises tachometer 34, operational amplifier 16, current regulating regenerative logic circuit 66, armature controlled rectifier firing circuit 64, armature controlled rectifier bridge 62 and armature 24. The outer loop controls the operation of control 10 as long as operational amplifier 16 is unsaurated. When operational amplifier 16 saturates, the above described outer loop becomes inoperative since further error signal changes in conductor 40 are not transmitted through operational amplifier 16. For normal speed regulating operation, however, the operational amplifier of the outer loop is not saturated and the inner loop serves as an active part of the outer loop.

The inner operational loop is used to regulate armature current at all times in accordance with the amplified error signal from amplifier 16. It comprises the armature current feedback signal in conductor 70, current regulating and regenerative logic circuit 66, armature controlled rectifier firing circuit 64, armature controlled rectifier bridge 62, and armature 24. The inner loop is a complete feedback regulator employing as a reference signal one of the outputs of amplifier 16, as selected by the logic portion of current regulating and regenerative logic circuit 66, and as feedback, the signal in conductor 70. The gain and response of this inner loop regulator are sufficient to cause the armature current to accurately and rapidly follow the signal from amplifier 16, thereby causing the magnitude of armature current to be proportional to the error signal in conductor 40. However, when the error signal becomes large enough to saturate the outputs of amplifier 16, further increases in error signal can no longer cause an increase in armature current, since the reference signal to the inner current loop regulator cannot be larger than the saturated output of amplifier 16. In this manner the maximum armature current is sharply limited to a value corresponding to the saturated output of amplifier 16. One other consideration is important. Since the output of amplifier 16 may change almost instantly from a low level to its highest value the nature of response of the inner loop current regulator to an instantaneous rise in reference signal must include a complete lack of overshoot to prevent transient currents from being larger than the desired maximum value.

The field circuit 18 is operated open loop at or below the base speed of D.C. motor 22 except for the field polarity signal in conductor 68 and 69 to current regulating and regenerative logic circuit 66. Above the base speed of D.C. motor 22, field weakening is required.

To operate control 10, switch 72 is closed to energize the circuitry of the control. Reference signal source 30 is adjusted to provide a signal corresponding to desired speed. The signal is supplied through conductor 32 to junction 38 and thence to operational amplifier 16. Operational amplifier 16 produces a direct output signal and an inverse output signal proportional to the input signal in conductor 40. As armature 24 is not yet rotating there will be no feedback signal supplied by tachometer 34.

Field circuit 18 utilizes one of the output signals from operational amplifier 16 to turn on either rectifiers 44 and 46 or rectifiers 48 and 50 by means of field controlled rectifier firing circuit 52. The desired direction of rotation of the motor is determined by which of the two groups of controlled rectifiers is turned on.

Both the inverse output signal and the direct output signal of operational amplifier 16 are supplied to current regulating and regenerative logic circuit 66. This circuit determines whether conditions in control 10 are proper for motoring or regenerative operation by means of the polarity of the output signals of operational amplifier 16 and the motor field polarity signals in conductors 68 and 69. These signals operate the pair of AND gates in the logic portion of current regulating and regenerative logic circuit 66 and operate the armature circuit accordingly. For the present motoring operation, the logic portion of current regulating and regenerative logic circuit 66 determines that control 10 is, in fact, capable of such operation and passes the amplified error signal to the inner current regulating loop and thence to armature controlled rectifier firing circuit 64. Armature controlled rectifier firing circuit 64 provides a firing signal to the controlled rectifiers of armature controlled rectifiers bridge 62 to energize armature 24 and accelerate the armature.

Acceleration of the armature 24 causes tachometer 34 to generate a feedback signal in conductor 36 which reduces the magnitude of the error signal in conductor 40. This likewise reduces the magnitude of both outputs of operational amplifier 16 and causes armature controlled rectifier firing circuit 64 to retard the firing angle of the controlled rectifiers in armature controlled rectifier bridge 62. Regulation of the speed of armature 24 is obtained by controlling the point of firing of the controlled rectifiers in armature controlled rectifier bridge 62 between time $T_1$ and time $T_2$, as shown in FIG. 2, by the combined operation of the inner and outer operational loops.

Regenerative operation of control 10 may be brought on by reducing the reference signal in conductor 32 or by providing an overhauling load to armature 24. In either case, the feedback signal generated by tachometer 34 in conductor 36 exceeds the reference signal generated by reference signal source 30 in conductor 32. This reverses the polarity of the error signal in conductor 40 and hence the polarity of the inverse output signal and direct output signal from operational amplifier 16. Because of the high gain of operational amplifier 16 a small reversal in the polarity of the error signal is sufficient to initiate regenerative operation.

The reversed polarityof the output signal from operational amplifier 16 to field controlled rectifier firing circuit 52 causes the latter circuit to energize the other group of controlled rectifiers in field circuit 18 reversing the current through motor field 26. The time of reversal is short because the inductive energy stored in the winding of motor field 26 is regenerated through transformer 42 to AC supply lines 28 and because resistors 54 and 56 reduce the time constant of the field. The reversal of motor field 26 reverses the counter E.M.F. of armature 24 and the polarity of the signal in conductors 68 and 69.

Operational amplifier 16 provides output signals of reversed polarity to the regenerative logic portion of current regulating and regenerative logic circuit 66. In the absence of the correct motor field polarity signal from conductors 68 and 69 the logic circuit produces no output at all. The correct signal in conductor 68 and 69, indicating motor field has completed reversal, provides a signal from current regulating and regenerative logic circuit 66 to armature controlled rectifier firing circuit 64 which controls the point of firing of the controlled rectifiers between time $T_3$ and $T_4$ as shown in FIG. 2 depending on the magnitude of the error signal in conductor 40. As described in connection with that figure this operation provides regenerative power to alternating current supply lines 28.

If the error signal in conductor 40 is excessively large during either motoring or regeneration, the operational amplifier 16 becomes saturated and control over armature circuit conditions is delegated to the inner loop including current regulating portion of current regulating and regenerative logic circuit 66. The current feedback signal is supplied from the armature circuit to the current regulating portion of current regulating and regenerative logic circuit 66. This circuit alters the output signal to armature controlled rectifier firing circuit 64, after comparing the feedback signal with a reference signal comprised of the saturated output of operational amplifier 16, to retard a firing angle of the controlled rectifiers in armature controlled rectifier bridge 62 to maintain the armature current at the desired maximum value.

The following comprises the detailed description of the various components of control 10 shown in FIG. 1. It is to be understood that the invention is not limited to the specific embodiments incorporated in this detailed description but may utilize equivalent circuits having similar functional characteristics.

DETAILED DESCRIPTION OF AMPLIFIER CIRCUIT

As previously mentioned, this amplifier has a single input and two outputs. Both of the output signals are proportional in magnitude to the input signal. However, the polarity of one output signal is the same as the polarity of the input signal while the other output signal is opposite in polarity to the input signal. The first mentioned output signal has been termed the direct output signal while the latter signal is termed the inverse output signal. The amplifier must, of course, be capable of handling input signals from conductor 40 of either polarity.

Figure 3:
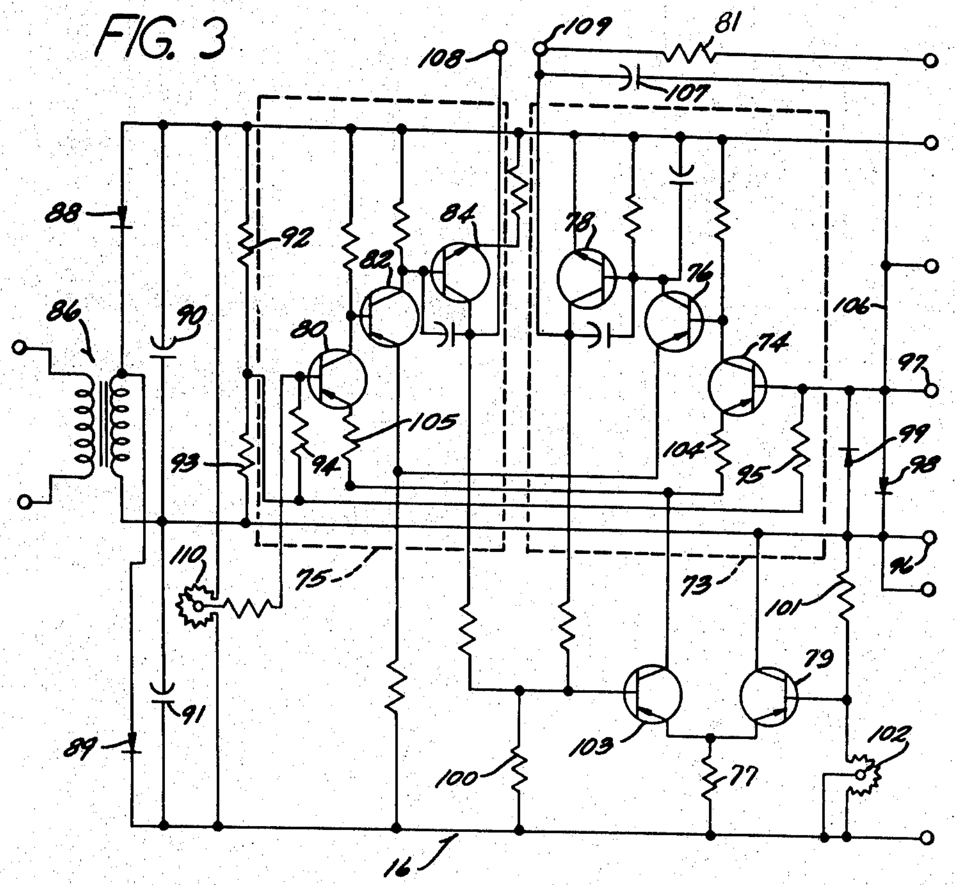
FIG. 3 is a detailed schematic drawing of the amplifier circuit of the present invention.

FIG. 3 shows a circuit suitable for use as amplifier circuit 16 of control 10. The operational amplifier contains two complementary, three-stage amplifiers. One such amplifier 73, is formed of transistors 74, 76 and 78 while the other such amplifier, 75, is formed from transistors 80, 82 and 84. The input transistors of each of the aforementioned amplifiers, that is, transistor 74, and transistor 80 are closely matched for identical characteristics, so that the tendency of one such transistor to drift under operating conditions will be closely matched by the same tendency of the other transistor, thereby producing equality in the overall effect on the two amplifiers.

Amplifiers 73 and 75 are powered by a power supply consisting of transformer 86, diodes 88, and 89 and capacitors 90 and 91. The power supply also includes a voltage divider consisting of resistor 92 and resistor 93.

For reason of overall circuit operation, it is desirable to maintain the input to input transistors 74 and 80 at zero volts. Thus, a low impedance path for the small base current required to establish the operating points of transistors 74 and 80 is provided by resistors 94 and 95 which are joined to the center of the voltage divider network. The voltage divider network provides a small voltage which is used to null the small voltage drop across resistors 94 and 95 caused by the current.

The input signal from conductor 40 is applied to operational amplifier 16 at terminals 96 and 97. A pair of diodes 98 and 99 connected in opposite polarities across input terminals 96 and 97 limit the magnitude of the input signals to that which can be handled by the operation of the amplifier. Specifically, when the magnitude of the input signal exceeds the forward conduction voltage of diodes 98 or 99, the diodes break down and short circuit terminals 96 and 97 thereby preventing an input signal in excess of the breakdown voltage from reaching amplifiers 73 or 75. This prevents excessive input signals from overdriving either of the amplifiers. Two diodes 98 and 99 are provided to accommodate input signals of either polarity.

The amplifier utilizes two feedback circuits. The first of these feedback circuits may be called the common mode feedback as it affects both transistor amplifier 73 and transistor amplifier 75 in an equal manner. The common mode feedback utilizes resistor 100 which measures the sum of the currents through the output of transistors 78 and 84, that is, through the collector and emitter terminals of those transistors. The feedback signal comprising the voltage developed across resistor 100 is compared with a reference signal generated by a voltage divider consisting of resistor 101 and a rheostat 102. The error signal between the feedback signal from resistor 100 and the reference signal from rheostat 102 is supplied through transistor 103 and resistors 104 and 105 to the emitters of transistors 74 and 80 to adjust the sum of the output of these transistors for any difference between the reference signal indicating actual total current. Transistor 79 and resistor 77 establish the operating point of transistor 103. It will be appreciated that a high degree of amplification is obtained through transistor 103 and the three transistors constituting each transistor amplifier 73 and 75 thereby providing rapid, accurate regulation of the sum of the output of transistors 74 and 80.

The second feedback circuit in operational amplifier 16 is termed the differential feedback as it affects differentially amplifiers 73 and 75. This feedback may be resistive, inductive, or capacitive; the character of the feedback changing the operating characteristics of the amplifiers which the feedback serves. For example, varying the resistance of the feedback will vary the amount of gain of the amplifier, while varying the capacitance of the feedback will vary the repsonse time of the amplifier. Specifically, in FIG. 3 a differential feedback is shown by conductor 106 which provides a feedback signal from the emitter collector cricuit of transistor 78 through capacitor 107 to input terminal 97.

The output signals from operational amplifier 16 are supplied to terminals 108 and 109. The direct output signal appears at terminal 108 while the inverse output signal appears at terminal 109.

The first mode of operation, called the common mode, is one in which a given signal or phenomenon affects both transistor amplifiers 73 and 75 in an equal manner. Examples of common mode signals or phenomenon include variations in line voltage or variations in ambient temperature. As can be readily appreciated, it is necessary that such occurrences affect both transistor amplifier 73 and transistor amplifier 75 equally in order to maintain proper operation of control 10. The second mode of operation, termed the differential mode, is one in which a given signal or phenomenon affects one of the transistor amplifiers in a different manner than it affects the other transistor amplifier. Examples of differential mode signals include an input signal to terminals 96 and 97 or unequal drift of one or the other of transistor amplifiers 73 and 75.

As previously mentioned, the common mode feedback circuit including resistor 100 and the reference circuit including rheostat 102 insure that the total current flowing through output transistors 78 and 84 and transistor amplifiers 73 and 75 is equal to that established by the reference signal. Thus any changes in the total current due to such things as variations in line voltage or in ambient temperature are immediately corrected by the aforementioned reference and feedback signals and the high degree of amplification provided by transistor 103 and the three transistors in each of amplifiers 73 and 75.

Operation of operational amplifier 16 in the differential mode to obtain the aforementioned direct output signal and inverse output signal is obtained by first adjusting operational amplifier 16 so that the signals at output terminals 108 and 109 are both equal to zero. Once this is accomplished, variations in the output signal at terminal 109 due to an input signal to terminals 96 and 97, is accompanied by an equal and opposite change in the output signal at terminal 108, as the total current through both transistor amplifiers 73 and 75 must remain the same because of the above described regulation provided by the feedback signal from resistor 100 and the reference signal from rheostat 102.

To provide initial adjustment to operational amplifier 16, output terminal 109 is connected through resistor 81 to input terminal 97. Resistor 81 forms a negative feedback path which tends to reduce the output signal at terminal 109 of transistor amplifier 73 to zero potential with respect to terminal 96. The output signal at terminal 109 is brought to exactly zero by adjusting rheostat 110 to alter the current input to transistor amplifier 75. Assuming that the output signal at terminal 109 is greater than zero, a signal would be applied from rheostat 110 to the input of transistor amplifier 75 to cause that amplifier to conduct more heavily. This removes some of the current flowing through transistor amplifier 73 and reduces the output signal existing at terminal 109. The reduction in current through transistor amplifier 73 occurs because the total current flowing through both transistor amplifiers 73 and 75 must remain at the value regulated by rheostat 102 and hence an increase in the current flow in one amplifier must require a decrease in current flow in the other.

After the output signal at terminal 109 has been brought into coincidence with the voltage at input terminals 96 and 97, rheostat 102 is adjusted to alter the output signal at terminal 108 so that it is also at zero. Adjustment of rheostat 102, of course, changes the amount of current in the output of the two transistor amplifiers 73 and 75. However, since the output of transistor amplifier 73 is fixed by the feedback signal between its output terminal 109 and its input terminals 96 and 97, the output of transistor amplier 75 is varied, thereby to alter the output signal existing at terminal 108. The connection between output terminal 109 and input terminals 96 and 97 may then be removed and from this time on, an input signal to terminals 96 and 97 produces two equal output signals of opposite polarity.

It will be appreciated that the three stages of amplification in amplifiers 73 and 75 provide a high gain characteristic to operational amplifier 16. This allows the amplifier to be extremely sensitive to changes in the polarity of the error signal in conductor 40 to operate control 10 in the motoring state or the regenerative state as required by that signal. The "dead band" found in prior art controls of this type, in which the control is unable to operate in the correct state, is thereby eliminated.

As a general rule, the output signal at terminal 109, that is, the inverted output signal is connected to field control rectifier firing circuit 52 and to current regulating and regenerative logic circuit 66. The direct output signal from terminal 108 is also connected to the current regulating and regenerative logic circuit 66. However, it is anticipated that the connections of output terminals 109 and 108 to field control rectifier firing circuit 52 and to the current regulating and regenerative logic circuit 66 will be reversed in a considerable number of applications of control 10.

What is claimed is:

1. An amplifier circuit suitable for connection to a bi-polarity input signal and for providing a pair of bi-polarity output signals in response to said input signal, one of said output signals corresponding directly in polarity to the input signal, the other of said output signals being inverse in polarity with respect to the input signal, said amplifier circuit comprising:

a pair of complementary amplifiers having their inputs connected to said bi-polarity input signal and providing said bi-polarity output signals, a first of said amplifiers producing an output signal directly proportional in magnitude and having a constant polarity condition with respect to the polarity of said input signal, said amplifier circuit having a feedback control means responsive to the pair of output signals of said pair of amplifiers and operatively associated therewith for causing the electrical summation of the output signals of said complementary amplifiers to be equal to a constant value, a second of said amplifiers being operable by said feedback control means for producing an output signal opposite in polarity but equal in magnitude to the output signal produced by the first amplifier, thereby to maintain the electrical summation of said output signals constant and to generate the desired bi-polarity output signals.

2. The amplifier circuit of claim 1 wherein said feedback control means includes first signal means providing a constant value reference signal proportional in magnitude to the desired magnitude of the combined output signals of said amplifiers, second signal means providing a feedback signal proportional in magnitude to the actual sum of the output signals of said pair amplifiers, and third signal means responsive to said first and second signal means for providing an error signal, corresponding to the difference between said reference signal and said feedback signal to said pair of amplifiers.

3. The amplifier circuit of claim 1 wherein each of said complementary amplifiers has an input electron control device receiving said input signal, the input electron control device in each of said amplifiers having similar operating characteristics, so as to produce equality in the operating conditions of the pair of amplifiers.

4. The amplifier circuit of claim 1 wherein said amplifier circuit includes means for maintaining the inputs of said pair of complementary amplifiers at a condition of zero volts.

5. The amplifier circuit of claim 4 wherein each of said complementary amplifiers has an electron control device having an input receiving said input signal, said devices requiring an electron flow through the devices and their inputs to establish their operating condition, said amplifier circuit including means for providing a low impedance path for the electron flow through the inputs of the devices and a means to opopse the voltage generated by the electron flow through the impedance of said paths, thereby to maintain the inputs of said pair of complementary amplifiers at a condition of zero volts.

6. The amplifier circuit of claim 1 wherein said amplifier circuit includes a means for limiting the magnitude of the input signals applied to said complementary amplifiers.

7. The amplifier circuit of claim 6 wherein said means for limiting the magnitude of the input signals comprises a diode means interconnected in the inputs of said amplifiers for limiting the magnitude of the input signal to said complementary amplifiers to the forward conduction voltage of said diode means.

8. The amplifier circuit of claim 1 wherein at least one of said complementary amplifiers has a feedback control means for regulating the operating characteristics of said complementary amplifiers.

9. The amplifier circuit of claim 1 wherein said complementary amplifiers are of the high gain type, thereby to provide an abrupt saturation point in their output.

References Cited

UNITED STATES PATENTS

| | | | |
|---|---|---|---|
| 2,903,525 | 9/1959 | Cooke, Jr. | 330—117X |
| 3,247,462 | 4/1966 | Kobbe | 330—14 |
| 3,259,848 | 7/1966 | Rado | 330—14 |

ROY LAKE, Primary Examiner

S. H. GRIMM, Assistant Examiner

U.S. Cl. X.R.

330—17, 19, 26, 29, 124